(12) United States Patent
Wang

(10) Patent No.: US 12,107,387 B2
(45) Date of Patent: Oct. 1, 2024

(54) VERTICAL CAVITY SURFACE EMITTING LASER (VCSEL) ARRAY PACKAGE AND MANUFACTURING METHOD

(71) Applicant: Shenzhen Raysees AI Technology Co. Ltd., Shenzhen (CN)

(72) Inventor: Yang Wang, Dublin, CA (US)

(*) Notice: Subject to any disclaimer, the term of this patent is extended or adjusted under 35 U.S.C. 154(b) by 886 days.

(21) Appl. No.: 17/266,926

(22) PCT Filed: Aug. 22, 2018

(86) PCT No.: PCT/CN2018/101742
§ 371 (c)(1),
(2) Date: Feb. 8, 2021

(87) PCT Pub. No.: WO2020/037552
PCT Pub. Date: Feb. 27, 2020

(65) Prior Publication Data
US 2021/0296852 A1      Sep. 23, 2021

(51) Int. Cl.
| | |
|---|---|
| H01S 3/04 | (2006.01) |
| H01S 5/02234 | (2021.01) |
| H01S 5/0225 | (2021.01) |
| H01S 5/023 | (2021.01) |
| H01S 5/0233 | (2021.01) |
| H01S 5/02335 | (2021.01) |
| H01S 5/0234 | (2021.01) |
| H01S 5/02345 | (2021.01) |
| H01S 5/0235 | (2021.01) |

(Continued)

(52) U.S. Cl.
CPC ...... *H01S 5/02469* (2013.01); *H01S 5/02234* (2021.01); *H01S 5/0225* (2021.01); *H01S 5/023* (2021.01); *H01S 5/0233* (2021.01); *H01S 5/02335* (2021.01); *H01S 5/0234* (2021.01); *H01S 5/02345* (2021.01); *H01S 5/0235* (2021.01); *H01S 5/18305* (2013.01); *H01S 5/423* (2013.01); *H01S 5/02253* (2021.01); *H01S 5/183* (2013.01)

(58) Field of Classification Search
CPC ............ H01S 5/02469; H01S 5/02234; H01S 5/0225; H01S 5/023; H01S 5/0233; H01S 5/02335; H01S 5/0234; H01S 5/02345; H01S 5/0235; H01S 5/18305; H01S 5/423; H01S 5/02253; H01S 5/183
See application file for complete search history.

(56) References Cited

U.S. PATENT DOCUMENTS 5,708,280 A * 1/1998 Lebby ............... H01L 27/156
                                                                              257/82
5,905,750 A    5/1999 Lebby et al.
(Continued)

*Primary Examiner* — Kinam Park
(74) *Attorney, Agent, or Firm* — Jigang Jin

(57) ABSTRACT

A Vertical Cavity Surface Emitting Laser (VCSEL) array package includes a VCSEL array chip bonded on a substrate, a support structure surrounding the VCSEL array chip, and an optical component mounted on the support structure. The support structure is molded directly on the substrate using a high thermal conductivity molding material. The support structure covers all side surfaces of the VCSEL array chip to facilitate heat transfer through the chip's sides. A transparent layer is deposited on the output surface of the VCSEL array chip, which prevents the support structure from blocking an output beam during molding.

19 Claims, 7 Drawing Sheets

(51) Int. Cl.
*H01S 5/024*       (2006.01)
*H01S 5/183*       (2006.01)
*H01S 5/42*        (2006.01)
 H01S 5/02253     (2021.01)

(56) References Cited

U.S. PATENT DOCUMENTS

| | | | |
|---|---|---|---|
| 5,939,773 | A | 8/1999 | Jiang et al. |
| 6,486,562 | B1* | 11/2002 | Kato ............... H01L 23/4334 |
| | | | 257/796 |
| 2005/0093129 | A1 | 5/2005 | Inoguchi |
| 2006/0054901 | A1 | 3/2006 | Shoji et al. |
| 2007/0002566 | A1* | 1/2007 | Wu ................. G02F 1/133603 |
| | | | 362/330 |
| 2010/0283069 | A1* | 11/2010 | Rogers ............... H01L 31/1804 |
| | | | 257/E31.127 |
| 2012/0205699 | A1* | 8/2012 | Yoo ..................... H01L 25/167 |
| | | | 438/23 |
| 2012/0218773 | A1 | 8/2012 | Peiler et al. |
| 2014/0008778 | A1* | 1/2014 | Zhang ................ H01S 5/02345 |
| | | | 257/676 |
| 2015/0049498 | A1 | 2/2015 | Zhou |
| 2017/0353004 | A1* | 12/2017 | Chen ................. H01S 5/02234 |
| 2019/0115505 | A1* | 4/2019 | Tsai .................. H01S 5/02375 |
| 2019/0260180 | A1* | 8/2019 | Chuang ................ H01L 24/24 |
| 2020/0153203 | A1* | 5/2020 | Hatzilias ................ H01S 5/183 |

\* cited by examiner

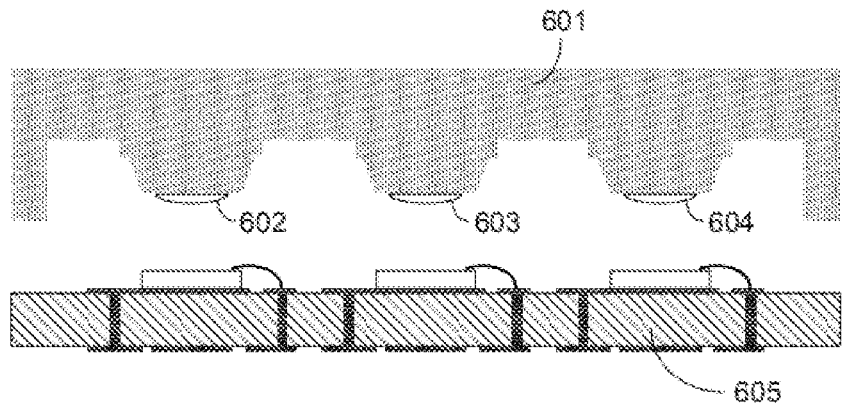
Fig.6.1
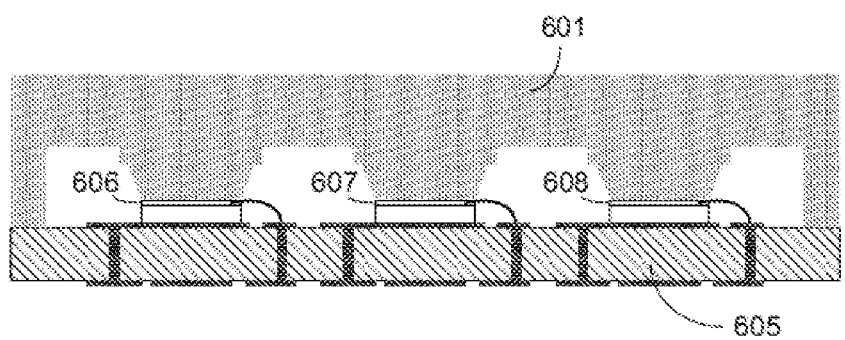
Fig.6.2
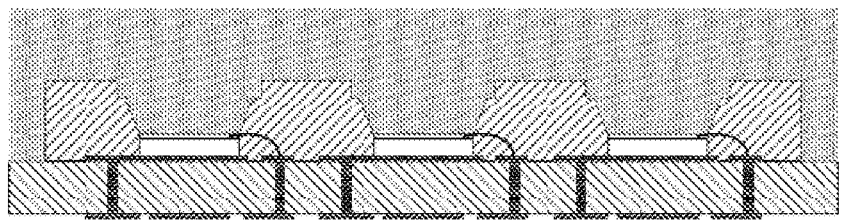
Fig.6.3

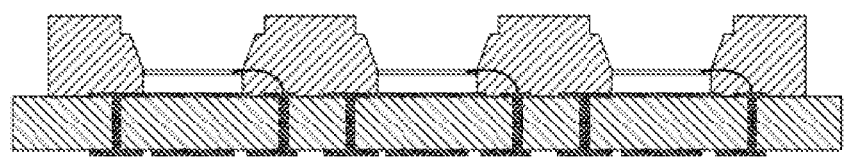
FIG. 6.4
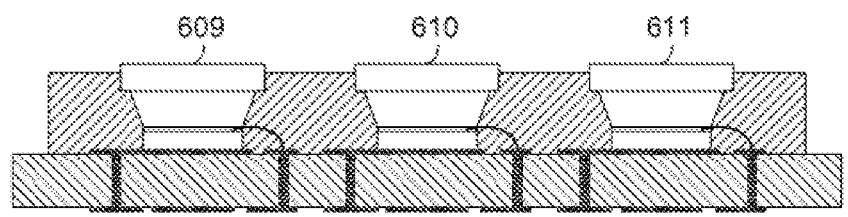
FIG. 6.5
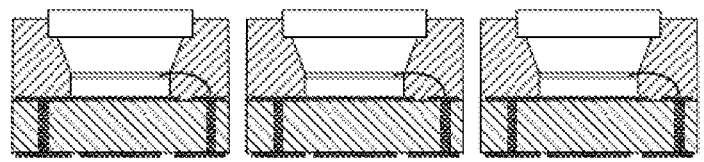
FIG. 6.6

VERTICAL CAVITY SURFACE EMITTING LASER (VCSEL) ARRAY PACKAGE AND MANUFACTURING METHOD

CROSS-REFERENCE TO RELATED APPLICATIONS

This application is the U.S. National Stage of International Application No. PCT/CN2018/101742, filed Aug. 22, 2018, the content of which is incorporated herein by reference in its entirety.

FIELD OF INVENTION

This invention generally relates to a Vertical Cavity Surface Emitting Laser (VCSEL) package and to the manufacturing method of the VCSEL array package.

BACKGROUND OF THE INVENTION

A VCSEL generates an output beam in the direction perpendicular to its top and bottom surfaces. Thanks to the surface emitting feature, wafer-level processing and testing, and surface-mount techniques, which are well developed in the semiconductor industry, can be utilized to manufacture VCSELs in high volume at a low cost. VCSELs are widely used in many fields. One emerging application is the three-dimensional (3D) sensing.

3D sensing capabilities represent a future trend of smartphones. 3D sensing technology enables accurate facial recognition and accurate gesture sensing which may be used in account access, payments, and immersive shopping and gaming activities. A 3D sensor comprises one or more cameras and at least one infrared laser as a miniature illuminator. The three-dimensional information may be obtained by the time-of-flight data or other methods based on calculation using algorithms.

A miniature illuminator for 3D sensing needs to be small and low cost to fit in the smartphone ecosystem. Apparently, VCSELs are a preferred choice over edge-emitting semiconductor lasers. Current VCSELs are already small and inexpensive. For instance, a typical VCSEL array package may have lateral dimensions of several millimeters and a thickness of three millimeters or less. These numbers, however, are still unsatisfactory for smartphone applications. Besides, there is always a need for a thinner, lighter, more powerful, and less expensive smartphone. Hence, demands for VCSEL array package size reduction and cost reduction are strong.

Therefore, there exists a need for a VCSEL array package which is smaller in size and less expensive than the current ones.

The operation of a VCSEL array chip is affected by the current-induced self-heating effect and large thermal impedances. The large thermal impedances are caused by the small chip size and the poor thermal conductivity of the vertical cavity's distributed Bragg reflectors (DBRs). The resultant high junction temperature becomes a major factor limiting the performance of VCSELs, which may cause premature saturation of the output power. Hence, it is important to improve the thermal management of a VCSEL array chip. Typically, a VCSEL's thermal path goes from the chip to the substrate through the chip's bottom surface. A VCSEL array chip's top and side surfaces contribute little in heat dissipation since they are surrounded by air or vacuum which are good in thermal insulation. But a VCSEL array chip's bottom surface inherently has a limited area due to its small dimensions and thus only provides limited heat dissipation capabilities.

Therefore, there is a need to create additional thermal paths to enhance the heat dissipation of a VCSEL array chip.

SUMMARY OF THE INVENTION

In one embodiment of the present invention, an improved VCSEL array package is disclosed. The improved VCSEL array package comprises a VCSEL array chip bonded on a substrate, a support structure which is molded directly on the substrate using a high thermal conductivity molding material, and an optical component mounted on the support structure. The support structure surrounds the VCSEL array chip and covers the side surfaces of the chip. The improved VCSEL array package eliminates the gap between a support structure and a chip's four sides, which not only makes a VCSEL array package smaller, but also enhances heat dissipation of a VCSEL array chip by creating additional thermal paths through the side surfaces.

In another embodiment of the present invention, a transparent thin layer is deposited on the top surface of a VCSEL array chip before a high thermal conductivity molding material is injected to form a support structure. In the present invention, the term "transparent" means fully transparent or substantially transparent. The transparent thin layer is transparent at the wavelengths of interest. The transparent thin layer prevents the molding material from blocking an output beam. The layer also reduces reflection of an output beam on the top surface.

In yet another embodiment, a bond wire, which electrically connects a contact pad on a VCSEL array chip and a contact pad on a substrate, is buried in a molding material when a support structure is formed. The wire becomes part of the support structure, instead of occupying its own space inside a VCSEL array package. Such a design makes the whole VCSEL array package more compact and further reduces the size of a VCSEL array package.

In yet another embodiment of the present invention, multiple VCSEL array chips are bonded on a substrate. A mold is pressed on the top surfaces of the VCSEL array chips to convert a transparent adhesive volume into a transparent thin layer on each top surface. Then the transparent thin layer is cured and a high thermal conductivity molding material is injected into the voids created by the mold, the VCSEL array chips, and the substrate. The injected molding material surrounds the VCSEL array chips and covers side surfaces of the chips. The mold is removed after the molding material is cured. Then optical components are mounted on the cured molding material, where each optical component is aligned to a corresponding VCSEL array chip. Finally, the cured molding material is sawed to create individual VCSEL array packages, where each package comprises a VCSEL array chip on a substrate and an optical component on a support structure.

The present invention has many advantages over prior art VCSEL array packages due to a support structure which is molded on a substrate directly. First, unlike prior art VCSEL array packages, there is no gap between a support structure and a VCSEL array chip's side surfaces. Consequently, the external dimensions of a VCSEL array package are reduced. Second, unlike prior art VCSEL array packages, a support structure covers four side surfaces of a VCSEL array chip, creating additional thermal paths for heat dissipation through the side surfaces. Third, unlike prior art VCSEL array packages, a support structure is directly molded on a substrate, therefore, simplifying the packaging process. Fourth, the cost of a VCSEL array package is reduced as a result of smaller device dimensions, smaller component dimensions, less materials involved, and a simplified packaging process.

BRIEF DESCRIPTION OF THE DRAWINGS

The subject matter, which is regarded as the invention, is particularly pointed out and distinctly claimed in the claims at the conclusion of the specification. The foregoing and other features and also the advantages of the invention will be apparent from the following detailed description taken in conjunction with the accompanying drawings. Additionally, the leftmost digit of a reference number identifies the drawing in which the reference number first appears.

FIGS. 6.1, 6.2, 6.3, 6.4, 6.5, and 6.6 illustrate an exemplary process for packaging multiple VCSELs, according to one embodiment of the present invention;

DETAILED DESCRIPTION

Figure 1:
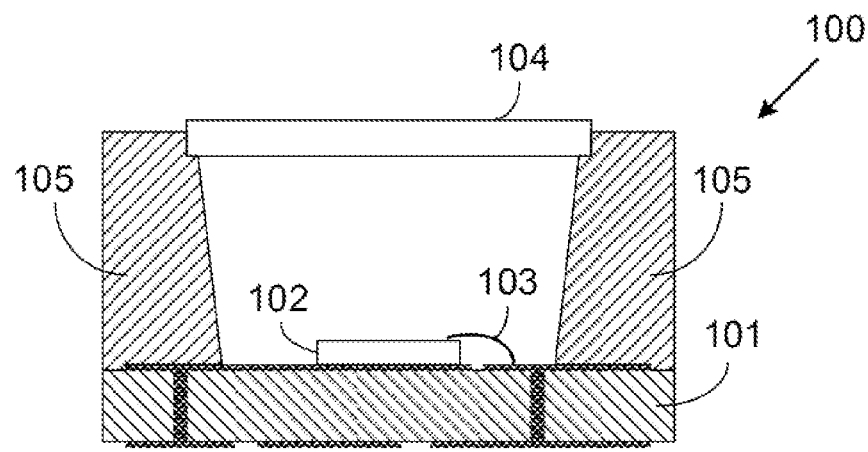
FIG. 1 illustrates a cross-sectional view of a prior art VCSEL array package.

FIG. 1 describes a prior art VCSEL array package in a cross-sectional view. A VCSEL array package 100 comprises a substrate 101, a VCSEL array chip 102, a bond wire 103, a support structure 105, and an optical component 104. A typical packaging process includes chip bonding, wire bonding, attaching the support structure, and mounting the optical component. It is seen that the inner dimensions of support structure 105 have to be larger than chip 102 to a certain extent. Otherwise, when the support structure is placed on substrate 101, it may easily hit chip 102 or bond wire 103. Thus, the gaps between support structure 105 and the sides of chip 102 are arranged for protecting the chip and the bond wire and thus can't be eliminated. Hence, the minimum external dimensions of a VCSEL array package in a lateral direction depend on three factors, the size of a VCSEL array chip, the lateral thickness of a support structure, and the gap between the support structure and the chip. For a typical VCSEL array package, the size of a VCSEL array chip has a minimum limit, the lateral thickness of a support structure also has a minimum limit to maintain the mechanical strength, and the gap is needed. Thus, there is little room left to reduce the size of a prior art VCSEL array package. In addition, if the size of a support structure has a minimum limit, a corresponding optical component, which is mounted on the support structure and has to fit the structure, faces a minimum limit and has little room for size reduction too.

Figure 2:
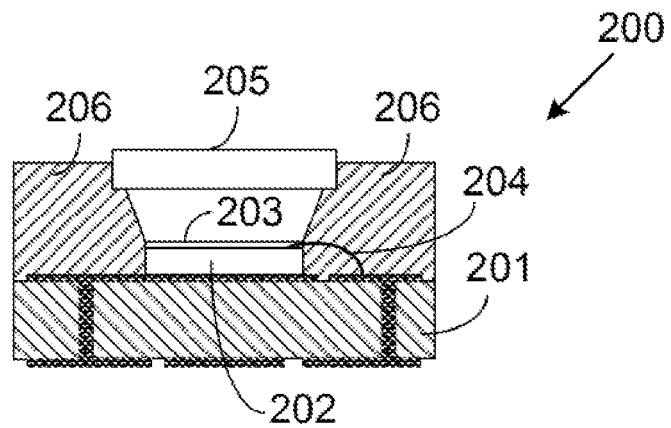
FIG. 2 illustrates a cross-sectional view of an exemplary VCSEL array package, according to one embodiment of the present invention.

FIG. 2 illustrates an exemplary VCSEL array package 200 in a cross-sectional view, according to one embodiment of the present invention. A VCSEL array chip 202 is bonded on a substrate 201. The chip is surrounded by a support structure 206 and covered by a transparent thin layer 203 on the top surface. A bond wire 204 connects a contact pad on the chip's top surface and a contact pad on substrate 201 electrically. An optical component 205 is mounted on the support structure.

Compared to a prior art VCSEL array package, such as the one shown in FIG. 1, VCSEL array package 200 has a smaller size. The size reduction is realized by eliminating the gap between support structure 206 and the side surfaces of chip 202. Furthermore, when the support structure's lateral dimensions are reduced, its height and lateral thickness may be reduced accordingly. Thus, the overall dimensions of VCSEL array package 200 are reduced.

Support structure 206 surrounds chip 202 and covers the chip's side surfaces. It also buries bond wire 204, which electrically connects chip 202 and a contact pad on substrate 201. Thus, bond wire 204 becomes part of support structure 206 and there is no need to leave an empty area on substrate 201 to accommodate the bond wire.

Layer 203 is arranged to cover the top surface of chip 202 and prevent a molding material from blocking laser beam output from the top surface when support structure 206 is molded. For the best optical performance, layer 203 is transparent at the wavelengths of interest. Any non-uniformities or unevenness, such as irregular interfaces, bubbles, lumps, and particles, should be excluded from the layer, especially in the area where an output beam goes through. In addition, layer 203 should not generate significant interface stress on the top surface of chip 202 to reduce chances to affect the performance of VCSEL array package 200. Furthermore, the refraction index of layer 203 should be low, which reduces reflection of an output beam on the top surface. Layer 203 may be made using a liquid adhesive compound. The liquid adhesive compound should be transparent at the wavelengths of interest after it is cured. One example of transparent adhesive materials is silicone or silicone compound.

Chip 202 may be a top emitting VCSEL die or bottom emitting (or backside emitting) VCSEL die. When a bottom emitting die is used, it is flipped before the die bonding or chip bonding step, i.e., the top surface of chip 202 is the bottom of the die. Chip 202 may also be a bottom-emitting VCSEL die prepared for flip-chip bonding, where electrical connections are made using solder bumps, instead of bond wires.

Moreover, chip 202 may contain multiple VCSELs or a VCSEL array to produce multiple output beams and generate much higher output power. For instance, thousands of VCSELs may be configured on a chip. The output power may reach several watts. High power VCSELs are desirable for light detection and ranging (LIDAR) devices, which are expected to play a critical role in a sensing system of autonomous or self-driving vehicles. When multiple VCSELs are made on the same substrate, their bottom electrical contacts may be connected together, while their top contacts may be connected together or addressed individually.

Referring back to FIG. 2, substrate 201 may be a ceramic substrate with contact pads on both sides. Contact pads on the top side of substrate 201 may be used as bond pads for bonding a chip or a bond wire. Contact pads on the bottom side may be used as soldering pads in a surface mount assembly process. Some contact pads on the two sides of substrate 201 are connected by electrical feedthroughs, as shown in the figure. Substrate 201 preferably has high thermal conductivity.

Optical component 205 may be an optical diffuser which is used to provide high-uniformity illumination over a desired field of view and minimize high intensity bright spots. Optical component 205 may also be a lens or a lens system.

Figure 3:
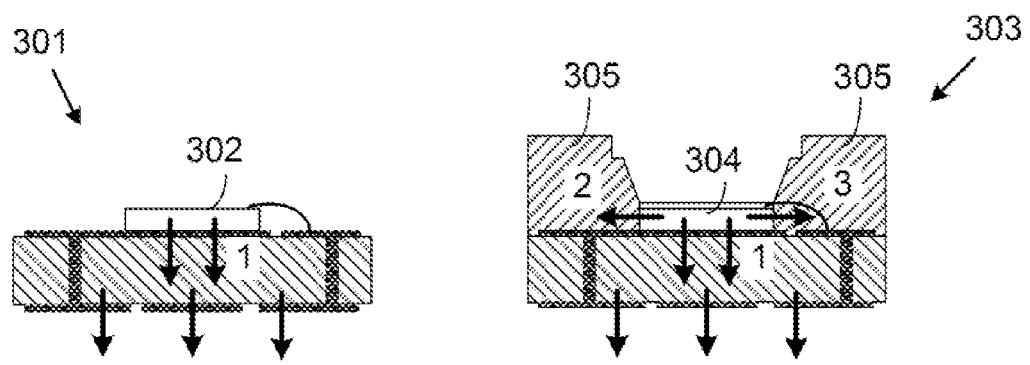
FIG. 3 illustrates a thermal path of a prior art VCSEL array package and thermal paths of an exemplary VCSEL array package according to one embodiment of the present invention.

FIG. 3 shows a prior art VCSEL array package 301 and an exemplary VCSEL array package 303 in cross-sectional views. Both VCSEL array packages have a VCSEL array chip bonded on a substrate. For brevity reasons, an optical component and a heat sink which may be arranged beneath a substrate are not shown and a support structure of VCSEL array package 301 is not shown either. In VCSEL array package 301, a chip 302 has only one side, the bottom side, connected to the substrate. As such, its top and side surfaces are thermally insulated. Thus heat generated by chip 302 is transferred from the chip to the substrate along a single path, thermal path 1, as depicted in the figure. The heat then goes from the substrate to a heat sink.

In VCSEL array package 303, a chip 304 has more than one thermal path to dissipate heat. Thermal path 1 goes from the chip to the substrate through the chip's bottom side. Since a support structure 305 covers the side surfaces of chip 304, heat may also be transferred to the substrate through thermal path 2 and thermal path 3. Thus, additional thermal paths are generated compared to prior art VCSEL array package 301. The added thermal paths go from chip 304's side surfaces to the substrate through support structure 305. For efficient thermal transfer, support structure 305 may be made from high thermal conductivity material. For instance, support structure 305 may be molded from a high thermal conductivity epoxy molding compound. Using four sides of a VCSEL array chip may increase the heat dissipation area remarkably.

Figure 4:
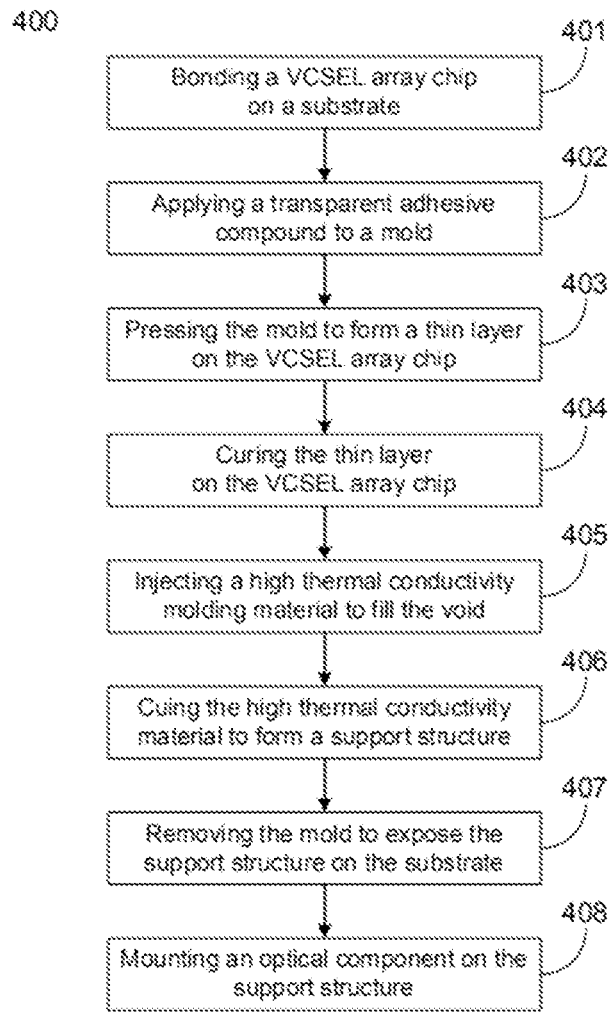
FIG. 4 illustrates an exemplary process for packaging a VCSEL, according to one embodiment of the present invention.

FIG. 4 illustrates an exemplary VCSEL packaging process 400, according to one embodiment of the present invention. At step 401, an electrically conductive adhesive paste is applied to a contact pad on a substrate. Then, a VCSEL array chip is attached to the contact pad. After a curing process, the chip is bonded on the substrate. Next, wire bonding procedures take place. One end of a bond wire is bonded on a contact pad on the top surface of the chip. The other end of the bond wire is bonded on a contact pad on the substrate. A bond wire may be gold wire, copper wire, or aluminum wire. At step 402, an optically transparent adhesive compound is applied to a protruded part of a mold. The adhesive compound is preferably in liquid state and forms a thin dome-shaped volume on the surface of the protruded part. At step 403, the mold is aligned to the chip such that the thin dome-shaped volume is above the chip precisely. Next, the mold is pressed against the chip to turn the thin dome-shaped volume into a transparent thin layer spreading over the top surface of the chip. At step 404, the transparent thin layer is at least partially solidified (e.g., cured at an elevated temperature). As aforementioned, the transparent layer should not create significant stress on the chip's top surface. And the layer should not have lumps, bubbles, or particles.

The transparent thin layer covers the top surface of the chip. It also buries a small section of the bond wire which is close to the chip's top surface. At step 405, a high thermal conductivity molding material is injected to the void, which is formed by the mold, the substrate, and the side surfaces of the chip. The high thermal conductivity molding material may be an adhesive compound or adhesive epoxy compound. The molding material surrounds the chip and covers the side surfaces of the chip. The molding material also buries the majority part of the bond wire which is exposed in the air after it is bonded. As the top surface of the chip is covered by the transparent thin layer, the molding material is kept away from it. The molding material is also kept away from other regions where an output beam passes through. At step 406, the high thermal conductivity molding material is cured at an elevated temperature to form a support structure. The support structure covers the chip's side surfaces to facilitate heat transfer from the chip to the support structure and then to the substrate and a heat sink. Besides a small section in the transparent thin layer, the bond wire is mostly inside the support structure and becomes part of the structure. Cavities in the support structure affect thermal transfer efficiency and should be avoided when the molding material is injected to fill the void.

At step 407, when the mold is lifted, the support structure and the transparent thin layer appear. The support structure is attached to the substrate. The transparent thin layer is attached to the top surface of the chip. As mentioned, besides blocking the molding material, the transparent thin layer also reduces reflection of an output beam on the chip's top surface, since its refractive index may be much closer to the refractive index of the air. At step 408, an optical component, such as an optical diffuser, is aligned to the support structure and mounted on it.

Figure 5:
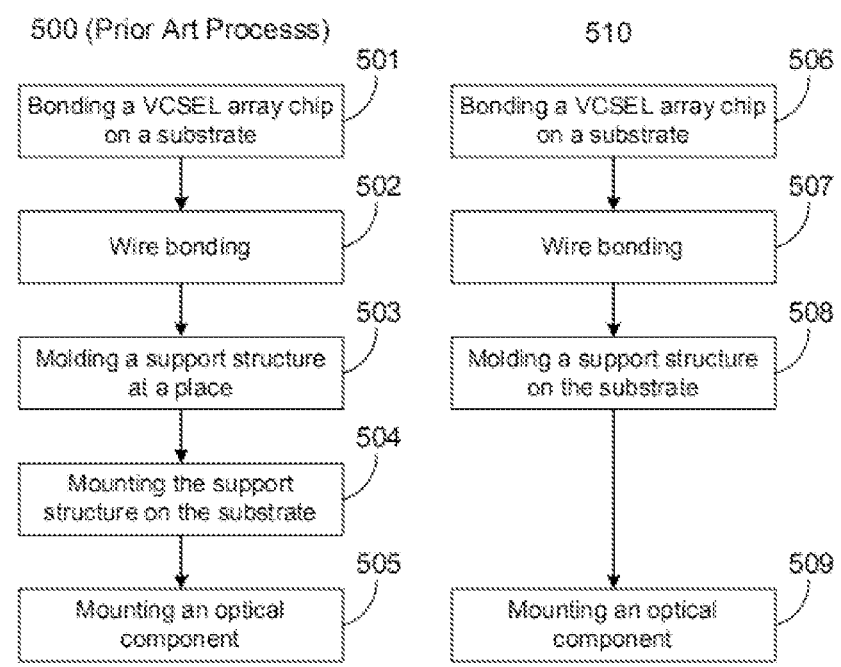
FIG. 5 illustrates a prior art packaging process and an exemplary packaging process according to one embodiment of the present invention.

FIG. 5 illustrates a prior art VCSEL packaging process 500 and an exemplary VCSEL packaging process 510. Process 500 contains five steps. At step 501, a VCSEL array chip is bonded on a substrate. At step 502, a bond wire is bonded. At step 503, a support structure is molded as a separate component. At step 504, the support structure is aligned to the VCSEL array chip and mounted on the substrate. At step 505, an optical component is mounted on the support structure.

Exemplary process 510, on the other hand, has four steps. At step 506, a VCSEL array chip is bonded on a substrate. At step 507, a bond wire is bonded. At step 508, a transparent thin layer is formed on the top of the chip and a support structure is molded on the substrate. At step 509, an optical component is mounted on the support structure. Because the support structure is molded directly on the substrate, at least step 504 in the prior art process is eliminated. Thus, exemplary process 510 has at least one fewer step than prior art process 500. Process 510 may reduce cost and improve yield.

FIGS. 6.1 to 6.6 illustrate an exemplary packaging process for packaging three VCSELs in cross-sectional views, according to one embodiment of the present invention. The method may be used to package more than three VCSELs as well. In FIG. 6.1, three VCSEL array chips are bonded on a substrate 605. Next, wire bonding techniques are used to bond three bond wires respectively. Then, a mold 601 is held at a short distance above substrate 605. Mold 601 has three protruded parts which are used to press on the VCSEL array chips. As shown in the figure, there are three thin dome-shaped volumes 602, 603, and 604 on the bottom surfaces of the protruded parts. The thin dome-shaped volumes are formed after a transparent adhesive compound is applied on the bottom surfaces. Next, the position of the mold is adjusted such that the thin dome-shaped volumes are aligned with the VCSEL array chips respectively.

In FIG. 6.2, mold 601 is pressed against the chips. The thin dome-shaped volumes are turned into three transparent thin layers 606, 607, and 608. Voids are formed by mold 601, the side surfaces of the VCSEL array chips, and substrate 605. In FIG. 6.3, a high thermal conductivity molding material is injected into the voids. The voids become filled with the molding material. Because there is a transparent thin layer between the mold and each VCSEL array chip, the molding material covers side surfaces of the VCSEL array chips but is kept away from reaching the top surfaces and blocking output beams of the VCSELs. The molding material solidifies in a curing process.

In FIG. 6.4, mold 601 is lifted off the substrate. The transparent thin layers are exposed, which are bonded on the top surfaces of the chips. The molded material becomes support structures attached to the substrate. Thus, unlike the prior art packaging process, there is no need to separately align molded support structures with the chips. At least one packaging step may be saved because support structures are molded on the substrate directly. In FIG. 6.5, optical components 609, 610, and 611 are mounted on the support structures. Finally, in FIG. 6.6, the VCSEL array packages are separated by sawing through the substrate and the molded material.

Figure 7:
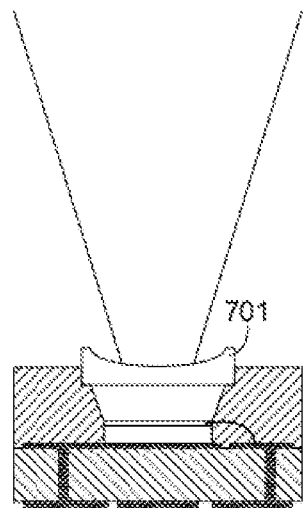
FIGS. 7, 8, 9, 10, 11, 12, 13, and 14 illustrate exemplary VCSEL array packages in cross-sectional views respectively, according to several embodiments of the present invention.
Figure 8:
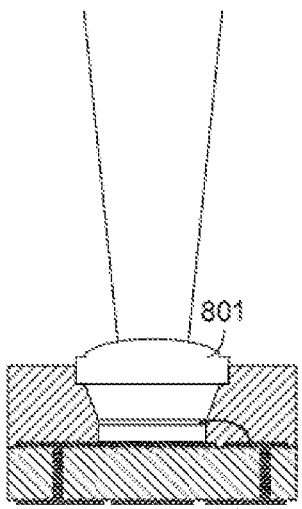

FIGS. 7 and 8 illustrate two exemplary VCSEL array packages in cross-sectional views, according to the present invention. An optical component, which is mounted on a support structure, may have various optical functionalities. For instance, an optical component may be a diffuser as mentioned or a simple or complex lens system. As shown in FIG. 7, an exemplary optical component 701 is a concave lens which makes an output beam more divergent to cover a larger area. In FIG. 8, an exemplary optical component 801 is a convex lens which makes an output beam less divergent.

In one embodiment of the present invention, it is optional for a VCSEL array package to have a transparent thin layer on a chip's top surface. When a VCSEL array package has a transparent thin layer, as in the aforementioned cases, the layer is transparent at the wavelengths of interest and preferably has an even, uniform, and flat top surface. Alternatively, a transparent thin layer may have a surface which is uneven and not uniform. It may reduce packaging cost as the flatness and uniformity requirements are lowered. A transparent thin layer may also be a domed-shape object and function as a convex lens. For instance, a mold may have a bowl-shaped pit on a protruded part. The pit may be filled with a transparent adhesive compound. When the protruded part is pressed against a chip, it creates a dome-shaped volume on the chip. After curing, the volume solidifies to become a convex lens. Furthermore, a transparent thin layer on the top surface of a VCSEL array chip may be replaced by a translucent thin layer when a translucent adhesive compound is used. A translucent thin layer on a VCSEL array chip may work as an optical diffuser.

Figure 9:
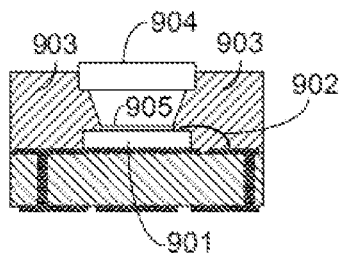

As discussed in the above, a transparent thin layer may be deposited on a VCSEL array chip's top surface to prevent a molding material from blocking an output beam. Usually an output beam is generated in a central area of a VCSEL array chip. Thus, as long as certain central area of a chip's top surface remains cleared and unobstructed, an output beam is not affected. Hence, a transparent thin layer may only need to cover a predetermined central area of a chip's top surface. FIG. 9 shows an exemplary VCSEL array package which illustrates such a configuration. A VCSEL array chip 901 is bonded on a substrate. A transparent thin layer 905 is deposited on the top surface of chip 901 and only covers a central part of the chip. Since chip 901's edge area is not covered by transparent thin layer 905, a molding material is deposited there during a molding process and stays there as part of a support structure 903.

As shown in FIG. 9, a bond wire 902 is arranged close to the edge of the chip and thus is not covered or buried by transparent thin layer 905. Then in a molding process, bond wire 902 is buried by a molding material and consequently becomes part of support structure 903 completely. When transparent thin layer 905 only needs to cover part of chip 901's top surface, a corresponding packaging process may become easier. It may improve yield and reduce cost. Moreover, because support structure 903 is pushed inward to utilize the space above chip 901's edge area, the size of the VCSEL may be reduced further. In addition, dimensions of an optical component 904, which is mounted on support structure 903, may be reduced too.

Figure 10:
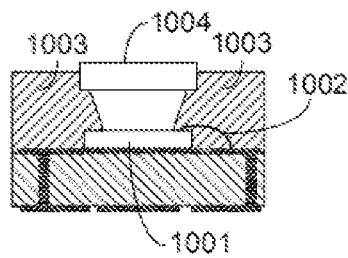

As discussed in the above, a transparent thin layer is deposited on the top surface of a VCSEL array chip to prevent a molding material from blocking an output beam. The transparent thin layer also reduces reflection of an output beam on the top surface. Alternatively, the transparent thin layer may be lifted off the top surface after a support structure is solidified and cured. FIG. 10 illustrates an exemplary VCSEL array package which includes a VCSEL array chip 1001, a bond wire 1002, a support structure 1003, an optical component 1004, and a substrate. Unlike examples discussed in the above, there is no transparent thin layer on top of the chip 1001. To minimize reflection of an output beam, an antireflection coating may be deposited on the top surface of chip 1001 when the chip is fabricated. At a molding step to make support structure 1003, a protective thin layer is still needed to block a molding material. The protective thin layer doesn't need to be transparent. It may be designed that when a mold is lifted off the substrate after the molding material is cured, the protective thin layer is removed too, which leaves the chip's top surface exposed to the air. Because bond wire 1002 is buried in support structure 1003 completely, removal of the protective thin layer does not affect the wire or the wire bonding. The method may be useful when there is no need to have a transparent thin layer.

Figure 11:
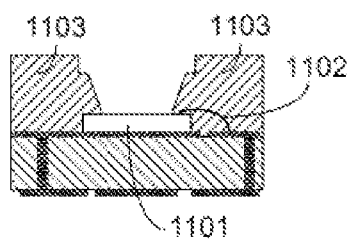

In another embodiment as shown in FIG. 11, a VCSEL array package includes a VCSEL array chip 1101, a bond wire 1102, a support structure 1103, and a substrate. The VCSEL doesn't have a transparent thin layer deposited on chip 1101's top surface. Nor does the VCSEL have an optical component mounted on support structure 1103, which may be desirable in some applications. Compared to a prior art device, the VCSEL array package has the same merits, i.e., smaller external dimensions, extra heat transfer paths, and at least one fewer packaging step.

As illustrated in FIGS. 6.1 and 6.2, transparent thin layers are deposited on VCSEL array chips through the following step. At the beginning, a transparent adhesive compound is applied to the protruded parts of a mold to create dome-shaped volumes. The mold is then pressed against the VCSEL array chips, which causes the dome-shaped volumes to become transparent thin layers on the top surfaces of the chips. Then the transparent thin layers are cured at an elevated temperature. Alternatively, a transparent adhesive compound may also be applied to top surfaces of the chips and created dome-shaped volumes there. Then a mold may be aligned with the chips and pressed against the chips. Again, the mold may push the dome-shaped volumes and turn the volumes into transparent thin layers. Next, the transparent thin layers may be hardened and cured. As discussed, a transparent thin layer doesn't need to cover the whole area of a chip's top surface. On the other hand, spreading of a transparent adhesive compound over the edge of a chip should be avoided, since the compound may pass the edge and covers the side surface of a chip. As a transparent adhesive compound may have poor thermal conductivity after curing, it may affect heat dissipation through the side surfaces. Thus, a transparent adhesive compound should not be allowed to cover the sides of a chip. When a dome-shaped adhesive volume is formed on a chip's top surface, the size of the volume has a maximum value to prevent overflow. Size control of the dome-shaped volume also applies when a dome-shaped volume is formed on the protruded part of a mold.

Figure 12:
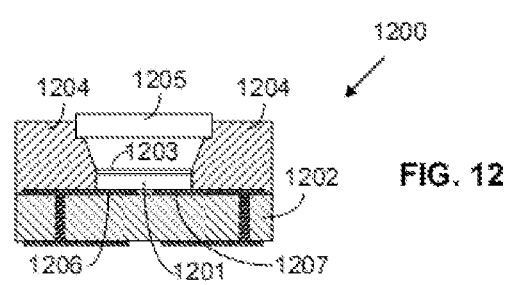

FIG. 12 illustrates an exemplary VCSEL array package 1200 in a cross-sectional view, according to the present invention. The VCSEL array package comprises a back-side emitting VCSEL array chip 1201. Metal contacts of the chip, as the VCSEL's cathode and anode terminals, are deposited on the chip's top surface, which is opposite to the back side. The chip is flip-chip bonded on a substrate 1202. During a bonding process, the metal contacts of chip 1201 are aligned respectively with corresponding contact pads 1206 and 1207 on substrate 1202 and then bonded with them by an electrically conductive adhesive material. As the chip is electrically connected to the substrate via metal contacts and contact pads, a bond wire is no longer needed. The VCSEL array package also comprises a transparent thin layer 1203 deposited on the back side of chip 1201 and a support structure 1204. The transparent thin layer 1203 is made from a transparent adhesive material. Support structure 1204 is molded from a high thermal conductivity epoxy molding compound. Optionally, the package may have an optical component 1205 mounted on support structure 1204. Optical component 1205 may include a simple or complex optical system. As shown in the figure, the chip's side surfaces are covered by support structure 1204 in a flip-chip design. Thus, like top-emitting VCSEL array chips in above discussions, additional thermal paths are created through the side surfaces and heat dissipation of the VCSEL array chip is improved.

Figure 13:
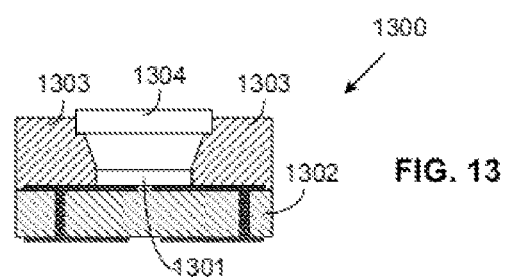

FIG. 13 illustrates an exemplary VCSEL array package 1300 in a cross-sectional view, according to the present invention. Like VCSEL array package 1200 of FIG. 12, VCSEL array package 1300 comprises a back-side emitting VCSEL array chip 1301, which is flip-chip bonded on a substrate 1302, a support structure 1303, and an optical component 1304. Optical component 1304 may include a simple or complex optical system. An antireflection layer (not shown in the figure) may be deposited on the back side of chip 1301 when chip 1301 is fabricated. A transparent thin layer was created during the packaging process but was later removed. Again, the chip's side surfaces are covered by the support structure in a flip-chip design. Therefore, additional thermal paths are created through the side surfaces and heat dissipation of the VCSEL array chip is improved.

Figure 14:
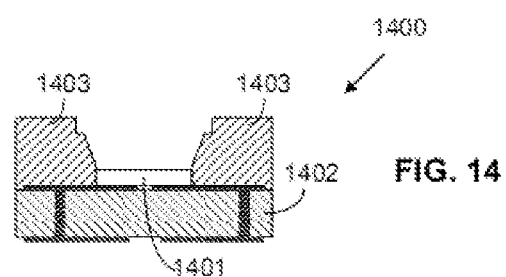

FIG. 14 illustrates an exemplary VCSEL array package 1400 in a cross-sectional view, according to the present invention. Like VCSEL array package 1200 of FIG. 12, VCSEL array package 1400 comprises a back-side emitting VCSEL array chip 1401, which is flip-chip bonded on a substrate 1402, and a support structure 1303. An antireflection layer (not shown in the figure) may be deposited on the back side of chip 1401 when chip 1401 is fabricated. Unlike the examples shown in FIGS. 12 and 13, there is no optical component mounted on support structure 1403, which may be desirable in certain applications. Once again, the chip's side surfaces are covered by the support structure in a flip-chip design. Therefore, additional thermal paths are created through the side surfaces and heat dissipation of the VCSEL array chip is improved.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

The claimed invention is:

1. A Vertical Cavity Surface Emitting Laser (VCSEL) array package, comprising:
a substrate;
a VCSEL array chip fixed on the substrate, wherein the VCSEL array chip has an upward facing light beam output surface, a downward facing surface, and at least one side surface, wherein the downward facing surface is bonded with the substrate; and
a support structure molded from a high thermal conductivity molding material, wherein the support structure is directly molded on the substrate and covers and is in direct contact with the at least one side surface of the VCSEL array chip to facilitate dissipating heat generated by the VCSEL array chip during operation.

2. The VCSEL array package of claim 1, further comprising a layer of transparent material covering at least part of the light beam output surface of the VCSEL array chip.

3. The VCSEL array package of claim 2, further comprising an optical component mounted on the support structure.

4. The VCSEL array package of claim 1, further comprising a bond wire whose two ends are bonded on the VCSEL array chip and the substrate, respectively, and wherein at least part of the bond wire is buried in the support structure.

5. The VCSEL array package of claim 1, wherein the VCSEL array chip is a top emitting VCSEL die.

6. The VCSEL array package of claim 1, wherein the VCSEL array chip is a bottom emitting VCSEL die and is mounted on the substrate via flip-chip method.

7. The VCSEL array package of claim 1, wherein the support structure covers all side surfaces of the VCSEL array chip.

8. The VCSEL array package of claim 7, wherein the support structure further covers an edge area of the light beam output surface of the VCSEL array chip.

9. The VCSEL array package of claim 3, wherein the optical component is an optical diffuser, an optical lens, or an optical lens system.

10. A method for packaging Vertical Cavity Surface Emitting Laser (VCSEL) array, the method comprising:
fixing a VCSEL array chip on a substrate with a light beam output surface facing upward;
pressing a mold against the VCSEL array chip and turning a transparent adhesive volume into a transparent layer structure on the light beam output surface of the VCSEL array chip, wherein the transparent layer structure covers at least part of the light beam output surface of the VCSEL array chip;
letting the transparent layer structure at least partially solidify;
injecting high thermal conductivity molding material to fill a gap between the substrate and the mold, wherein the high thermal conductivity molding material covers at least one side surface of the VCSEL array chip to facilitate heat dissipation;

letting the high thermal conductivity molding material solidify to form a high thermal conductivity support structure, wherein the high thermal conductivity support structure is in direct contact with the at least one side surface; and removing the mold to expose the support structure on the substrate.

11. The method of claim 10, further comprising fixing an optical component on the support structure.

12. The method of claim 10, further comprising bonding two ends of a bond wire on the VCSEL array chip and the substrate, respectively, and wherein the bond wire is completely buried in the support structure after the support structure is molded.

13. The method of claim 12, further comprising removing the transparent layer structure.

14. The method of claim 10, wherein the support structure covers all side surfaces of the VCSEL array chip.

15. The method of claim 14, wherein the support structure further covers an edge area of the light beam output surface of the VCSEL array chip.

16. The method of claim 11, wherein the optical component is an optical diffuser, an optical lens, or an optical lens system.

17. The method of claim 10, wherein the VCSEL array chip is a bottom emitting VCSEL die and is fixed on the substrate via flip-chip method.

18. A method for packaging Vertical Cavity Surface Emitting Laser (VCSEL) array, the method comprising:

fixing a plurality of VCSEL array chips on a substrate with light beam output surfaces of the plurality of VCSEL array chips facing upward;

pressing a mold against the plurality of VCSEL array chips and turning a plurality of transparent adhesive volumes into a plurality of transparent layer structures on the light beam output surfaces, wherein the plurality of transparent layer structures covers the light beam output surfaces of the plurality of VCSEL array chips respectively and at least partially;

letting the plurality of transparent layer structures at least partially solidify;

injecting high thermal conductivity molding material to fill gaps between the substrate and the mold, wherein the high thermal conductivity molding material covers all side surfaces of each of the plurality of VCSEL array chips to facilitate heat dissipation;

letting the high thermal conductivity molding material solidify to form a high thermal conductivity support structure, wherein the high thermal conductivity support structure is in direct contact with at least one of the side surfaces;

removing the mold to expose the support structure on the substrate; and fixing a plurality of optical elements on the support structure.

19. The method of claim 18, further comprising cutting the support structure and the substrate into a plurality of VCSEL array packages.

* * * * *